(12) United States Patent
Wang

(10) Patent No.: US 10,249,571 B2
(45) Date of Patent: Apr. 2, 2019

(54) THIN FILM TRANSISTOR AND MANUFACTURING METHOD THEREOF, ARRAY SUBSTRATE, AND DISPLAY PANEL

(71) Applicant: BOE Technology Group Co., Ltd., Beijing (CN)

(72) Inventor: Meili Wang, Beijing (CN)

(73) Assignee: BOE Technology Group Co., Ltd., Beijing (CN)

( * ) Notice: Subject to any disclaimer, the term of this patent is extended or adjusted under 35 U.S.C. 154(b) by 191 days.

(21) Appl. No.: 15/127,991

(22) PCT Filed: Oct. 30, 2015

(86) PCT No.: PCT/CN2015/093394
§ 371 (c)(1),
(2) Date: Sep. 21, 2016

(87) PCT Pub. No.: WO2016/197526
PCT Pub. Date: Dec. 15, 2016

(65) Prior Publication Data
US 2018/0174980 A1   Jun. 21, 2018

(30) Foreign Application Priority Data

Jun. 8, 2015 (CN) .......................... 2015 1 0309195

(51) Int. Cl.
*H01L 23/552* (2006.01)
*H01L 29/786* (2006.01)
(Continued)

(52) U.S. Cl.
CPC ...... *H01L 23/552* (2013.01); *H01L 21/28008* (2013.01); *H01L 27/1225* (2013.01);
(Continued)

(58) Field of Classification Search
CPC ............. H01L 23/552; H01L 21/28008; H01L 27/1225; H01L 29/66969
See application file for complete search history.

(56) References Cited

U.S. PATENT DOCUMENTS

| | | |
|---|---|---|
| 2004/0135148 A1 | 7/2004 | Lin |
| 2009/0230390 A1* | 9/2009 | Gosain ................ H01L 29/4908 257/43 |

(Continued)

FOREIGN PATENT DOCUMENTS

| | | |
|---|---|---|
| CN | 101005083 A | 7/2007 |
| CN | 101330106 A | 12/2008 |

(Continued)

OTHER PUBLICATIONS

Jan. 16, 2018—(CN) Third Office Action Appn 201510309195.2 with English Tran.

(Continued)

*Primary Examiner* — Phuc Dang
(74) *Attorney, Agent, or Firm* — Banner & Witcoff, Ltd.

(57) ABSTRACT

A thin film transistor comprises an active layer; a light-protection layer disposed above the active layer and/or disposed beneath the active layer, the light-protection layer being configured to absorb light having a predetermined wavelength. By providing a light-protection layer above the active layer, light incident onto the channel region from top of the thin film transistor can be absorbed, while by providing a light-protection layer under the active layer, light incident onto the channel region from bottom of the thin film transistor can be absorbed, thereby effectively avoiding influence of light on the active layer of the channel region and ensuring a relatively strong light stability of the driving transistor in the thin film transistor. A method for manufacturing a thin film transistor and an array substrate compris- (Continued)

ing the thin film transistor as well as an array substrate and a display device comprising the thin film transistor are further provided.

19 Claims, 4 Drawing Sheets

(51) Int. Cl.
  *H01L 21/28* (2006.01)
  *H01L 27/12* (2006.01)
  *H01L 29/66* (2006.01)
(52) U.S. Cl.
  CPC ...... *H01L 29/66969* (2013.01); *H01L 29/786* (2013.01); *H01L 29/7869* (2013.01)

(56) References Cited

U.S. PATENT DOCUMENTS

| | | | |
|---|---|---|---|
| 2010/0006833 A1 | 1/2010 | Ha et al. | |
| 2011/0287593 A1* | 11/2011 | Endo | H01L 21/02554 438/197 |
| 2013/0187164 A1* | 7/2013 | Oshima | H01L 29/78693 257/59 |
| 2014/0183521 A1* | 7/2014 | Hsu | H01L 29/78633 257/43 |
| 2015/0087096 A1* | 3/2015 | Han | H01L 33/42 438/29 |
| 2016/0043102 A1* | 2/2016 | Zhang | H01L 21/77 257/72 |

FOREIGN PATENT DOCUMENTS

| | | |
|---|---|---|
| CN | 101626036 A | 1/2010 |
| CN | 101908489 A | 12/2010 |
| CN | 104657024 A | 5/2015 |
| CN | 104681623 A | 6/2015 |
| CN | 104900711 A | 9/2015 |
| EP | 2816603 A1 | 12/2014 |

OTHER PUBLICATIONS

Mar. 4, 2016—(WO) International Search Report and Written Opinion Appn PCT/CN2015/093394 with English Tran.
Sep. 29, 2017—(CN) Second Office Action Appn 201510309195.2 with English Tran.
May 17, 2017—(CN) First Office Action Appn 201510309195.2 with English Tran.

* cited by examiner

Light

Instability $\Delta V$

THIN FILM TRANSISTOR AND MANUFACTURING METHOD THEREOF, ARRAY SUBSTRATE, AND DISPLAY PANEL

The application is a U.S. National Phase Entry of International Application No. PCT/CN2015/093394 filed on Oct. 30, 2015, designating the United States of America and claiming priority to Chinese Patent Application No. 201510309195.2 filed on Jun. 8, 2015. The present application claims priority to and the benefit of the above-identified applications and the above-identified applications are incorporated by reference herein in their entirety.

TECHNICAL FIELD

Embodiments of the present disclosure relate to a thin film transistor and a method for manufacturing a thin film transistor, an array substrate, and a display device.

BACKGROUND

Oxide semiconductor materials which are intensively studied comprise IGZO (indium gallium zinc oxide), ITZO (indium tin zinc oxide) and the like. In such oxides materials, there are a lot of oxygen vacancy defect states containing two electrons therein. When these oxides in the thin film transistor (TFT) are irradiated by light, electrons in the oxygen vacancies are excited to have a transition to the vicinity of the conduction band of the oxide materials. When the light irradiation is removed, the returning speed of photo-generated electrons caused by oxygen vacancies to the ground state is slow, resulting in a large leakage current of TFT and a poor light stability of TFT.

At present, light-shielding organic materials, such as resin, BM (Black Matrix), CF (Color Filter) and the like, are commonly used in the industry for shielding oxide TFT (mainly the portion of the active layer) from light, which reduces intensity of the light irradiated onto the TFT and thus the influence on TFT characteristics by light irradiation. As illustrated in FIG. 1, a light-shielding layer for shielding TFT is made of resin material and reduces intensity of the light irradiated onto the TFT, so that the influence on oxide TFT characteristics by light irradiation can be improved.

However, the above method of shielding TFT by organic material is only applicable to a circumstance in which a light source irradiates from the top of the TFT. When the TFT has a bottom gate or top gate structure and light is incident onto the bottom of TFT, i.e., the light source irradiates TFT through the substrate, as illustrated in FIG. 2 and FIG. 3, the aforementioned organic material cannot shield the TFT from light irradiation and the channel region of the active layer is still irradiated by light, thus resulting in a large leakage current in TFT.

SUMMARY

One purpose of the present disclosure is to effectively reduce intensity of light irradiating on an active layer, so as to guarantee light stability of TFT.

Embodiments of the present disclosure provides a thin film transistor, comprising
an active layer; and
a light-protection layer disposed above the active layer and/or disposed beneath the active layer;
wherein the light-protection layer is configured to absorb light having a predetermined wavelength.

In one embodiment of the present disclosure, the thin film transistor further comprises:
a base substrate;
a gate electrode disposed on the base substrate;
a gate insulating layer disposed on the gate electrode; and
a source electrode and a drain electrode which are disposed on the gate insulating layer and are in contact with the active layer,
wherein the active layer is disposed above the gate insulating layer.

In one embodiment of the present disclosure, the thin film transistor further comprises:
a base substrate;
a source electrode and a drain electrode which are disposed on the base substrate and are in contact with the active layer;
a gate insulating layer disposed on the source electrode and the drain electrode; and
a gate electrode disposed on the gate insulating layer;
wherein the active layer is disposed above the base substrate.

In one embodiment of the present disclosure, a width of the active layer is equal to a width of the light-protection layer.

In one embodiment of the present disclosure, a width of the light-protection layer is greater than a width of the active layer.

In one embodiment of the present disclosure, the light-protection layer is configured to absorb light having a wavelength less than 539 nm.

In one embodiment of the present disclosure, a forbidden band gap of the light-protection layer is greater than 1.1 eV and less than 2.3 eV with a transmissivity lower than 70%.

In one embodiment of the present disclosure, the light-protection layer is made of metal oxide comprising at least one anion of fluorine, chlorine, bromine, sulfur, carbon, iodine and selenium and at least one cation of boron, aluminum, gallium, indium, tin, titanium, hafnium and silicon.

In one embodiment of the present disclosure, the light-protection layer is made of zinc based nitrogen oxide.

In one embodiment of the present disclosure, a thickness of the light-protection layer is 5-100 nm At least one embodiment of the present disclosure further provides a display device comprising a thin film transistor mentioned above.

At least one embodiment of the present disclosure further provides a method of manufacturing a thin film transistor, comprising:
forming an active layer; and
forming a light-protection layer above the active layer and/or beneath the active layer, the light-protection layer being configured to absorb light having a predetermined wavelength.

In one embodiment of the present disclosure, before forming the active layer, the method further comprises:
forming a gate electrode on a base substrate;
forming a gate insulating layer on the gate electrode; and
forming a source electrode and a drain electrode, which are in contact with the active layer, on the gate insulating layer;
wherein forming the active layer comprises forming the active layer above the gate insulating layer.

In one embodiment of the present disclosure, forming the active layer comprises forming the active layer on a base substrate;
the method further comprises:

forming a source electrode and a drain electrode, which are in contact with the active layer, on the substrate;

forming a gate insulating layer on the source electrode and the drain electrode; and forming a gate electrode on the gate insulating layer.

By providing a light-protection layer above the active layer, light incident onto the channel region from top of the thin film transistor can be absorbed, while by providing a light-protection layer under the active layer, light incident onto the channel region from bottom of the thin film transistor can be absorbed, thereby effectively avoiding influence of light on the active layer of the channel region and ensuring a relatively strong light stability of the driving transistor in the thin film transistor.

BRIEF DESCRIPTION OF THE DRAWINGS

In order to clearly illustrate the technical solutions of the embodiments of the disclosure, the drawings of the embodiments will be briefly described in the following; it is obvious that the drawings described below are only related to some embodiments of the disclosure and thus are not limitative of the disclosure.

DETAILED DESCRIPTION

In order to make objects, technical details and advantages of the embodiments of the disclosure apparent, the technical solutions of the embodiment will be described in a clearly and fully understandable way in connection with the drawings related to the embodiments of the disclosure. It is obvious that the described embodiments are just a part but not all of the embodiments of the disclosure. Based on the described embodiments herein, those skilled in the art can obtain other embodiment(s), without any inventive work, which should be within the scope of the disclosure.

Figure 1:
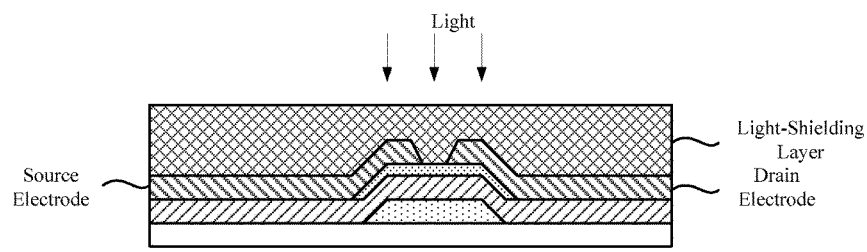
FIG. 1 is an illustrative structural view of a light-shielding layer in the conventional art.
Figure 2:
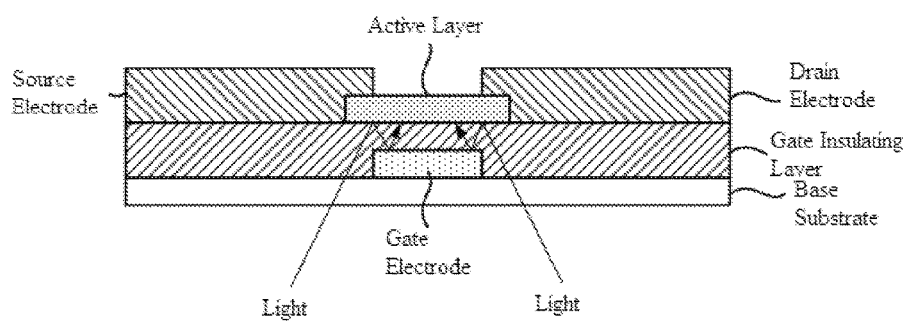
FIG. 2 is an illustrative view of a bottom gate structure in the conventional art.
Figure 3:
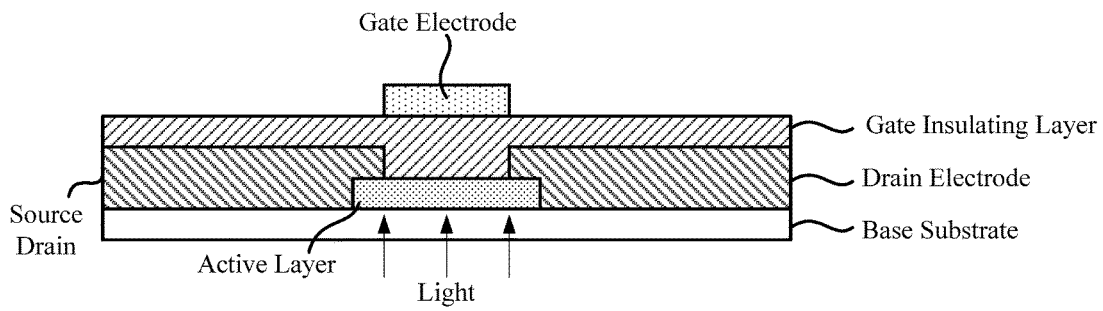
FIG. 3 is an illustrative view of a top gate structure in the conventional art.
Figure 4:
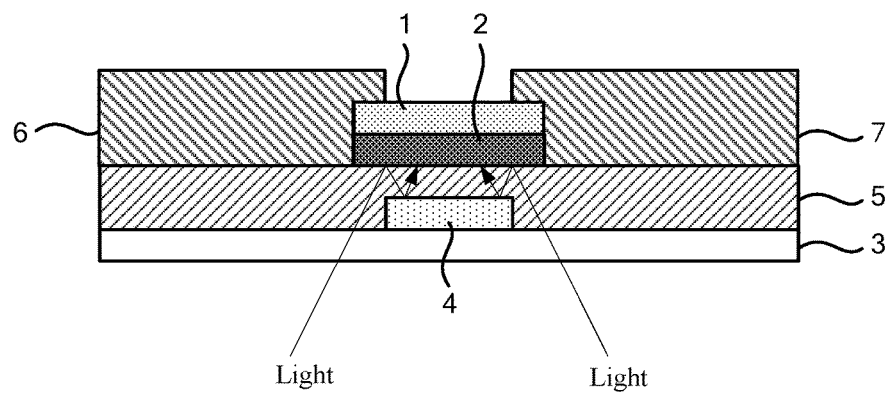
FIG. 4 is an illustrative structural view of a thin film transistor according to one embodiment of the present disclosure.

FIG. 4 illustrates a thin film transistor according to one embodiment of the present disclosure, which comprises:

an active layer 1;

a light-protection layer 2 disposed beneath the active layer 1 and configured to absorb light of predetermined wavelength.

The main defect state of oxygen vacancy affecting light stability of the active layer 1 has an energy level of 2.3 eV, and an optical wavelength corresponding to the energy level is 1240/2.3=539 nm. That is to say, light having a wavelength less than 539 nm will have oxygen vacancies excited, thereby affecting the stability of the active layer 1 and even the stability of the whole driving transistor.

By disposing the light-protective layer 2 beneath the active layer 1, light of predetermined wavelength (for example, less than 539 nm) incident on the active layer 1 can be absorbed so as to prevent light of short wavelength from being incident on the active layer 1 and prevent oxygen vacancies from being generated in the active layer 1, thereby ensuring the stability of the active layer 1 and the whole driving transistor.

In the embodiment as illustrated in FIG. 4, the thin film transistor further comprises:

a base substrate 3;

a gate electrode 4 disposed on the base substrate 3;

a gate insulating layer 5 disposed on the gate electrode 4;

a source electrode 6 and a drain electrode 7 which are disposed on the gate insulating layer 5 and are in contact with the active layer 1;

wherein the active layer 1 is disposed above the gate insulating layer 5.

FIG. 4 illustrates a structure of the driving transistor having a bottom gate structure in which the gate electrode 4 is disposed on the substrate. By providing a light-protection layer 2 beneath the active layer 1, when there is a light source at the bottom of the substrate 3 and thus light is incident on the bottom of the thin film transistor, the incident light can be effectively absorbed and the stability of the active layer 1 can be ensured.

Figure 5:
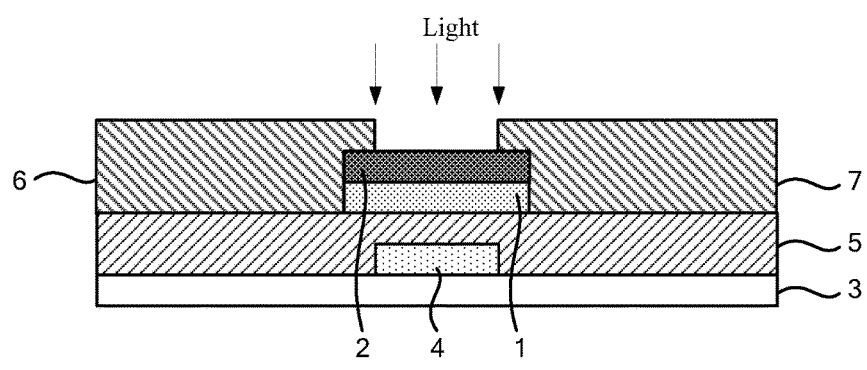
FIG. 5 is an illustrative structural view of a thin film transistor according to another embodiment of the present disclosure.

FIG. 5 illustrates a thin film transistor according to another embodiment of the present disclosure. The difference between the thin film transistor and the transistor illustrated in FIG. 4 lies in that the light-protection layer 2 is disposed above the active layer 1. When there is a light source at the top of the thin film transistor and thus light is incident from the top of the thin film transistor, the incident light can be effectively absorbed and the stability of the active layer 1 can be ensured.

Figure 6:
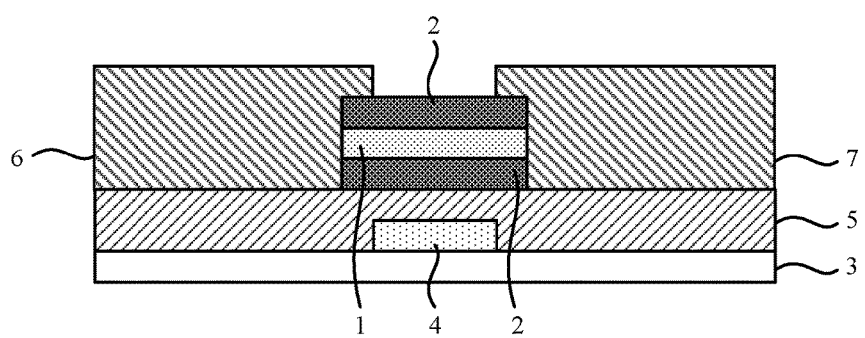
FIG. 6 is an illustrative structural view of a thin film transistor according to still another embodiment of the present disclosure.

As illustrated in FIG. 6, in yet another embodiment according to the present disclosure, light-protection layers can be provided above the active layer 1 as well as below the active layer 1. When there are light sources at the top and the bottom of the thin film transistor, light incident from both directions can be effectively absorbed and the stability of the active layer 1 can be ensured.

Figure 7:
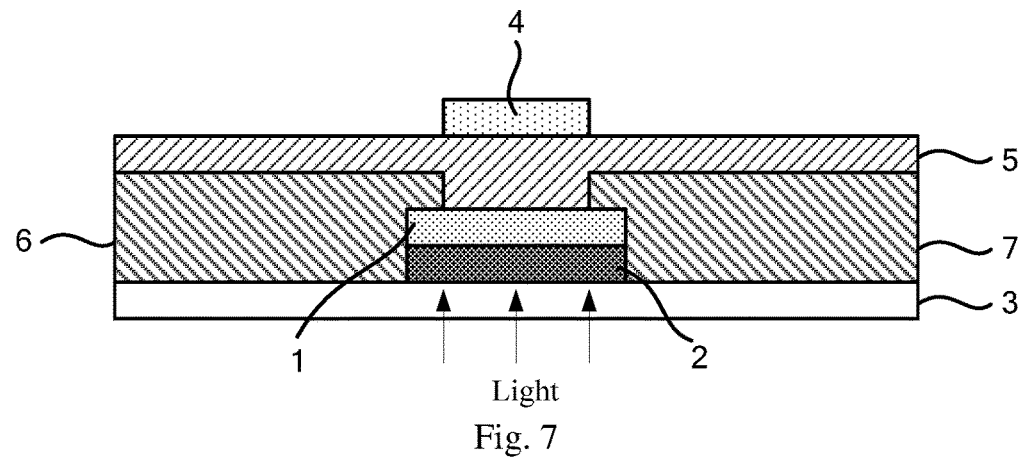
FIG. 7 is an illustrative structural view of a thin film transistor according to yet another embodiment of the present disclosure.

As illustrated in FIG. 7, the top gate type thin film transistor according to one embodiment of the present disclosure further comprises:

a base substrate 3;

a source electrode 6 and a drain electrode 7 which are disposed on the base substrate 3 and are in contact with the active layer 1;

a gate insulating layer 5 disposed on the source electrode 6 and the drain electrode 7;

a gate electrode 4 disposed on the gate insulating layer 5, wherein the active layer 1 is disposed above the base substrate 3.

In the structure of the top gate type thin film transistor as illustrated in FIG. 7, the gate electrode 4 is disposed on the gate insulating layer 5, while the gate insulating layer 5 is disposed above a channel region. By providing a light-protection layer 2 beneath the active layer 1, when there is a light source at the bottom of the substrate 3 and thus light is incident from the bottom of the thin film transistor, the incident light can be effectively absorbed, and thereby ensuring the stability of the active layer 1.

Figure 8:
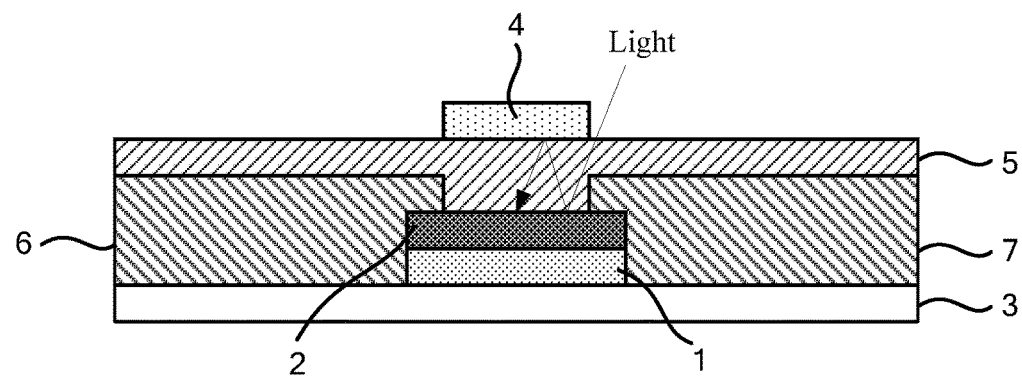
FIG. 8 is an illustrative structural view of a thin film transistor according to still another embodiment of the present disclosure.

FIG. 8 illustrates a top gate type thin film transistor according to one embodiment of the present disclosure, in which a light-protection layer 2 can be disposed on the active layer 1. When there is a light source at the top of the thin film transistor and thus light is incident from the top of the thin film transistor, the incident light can be effectively absorbed, and thereby ensuring the stability of the active layer 1.

Figure 9:
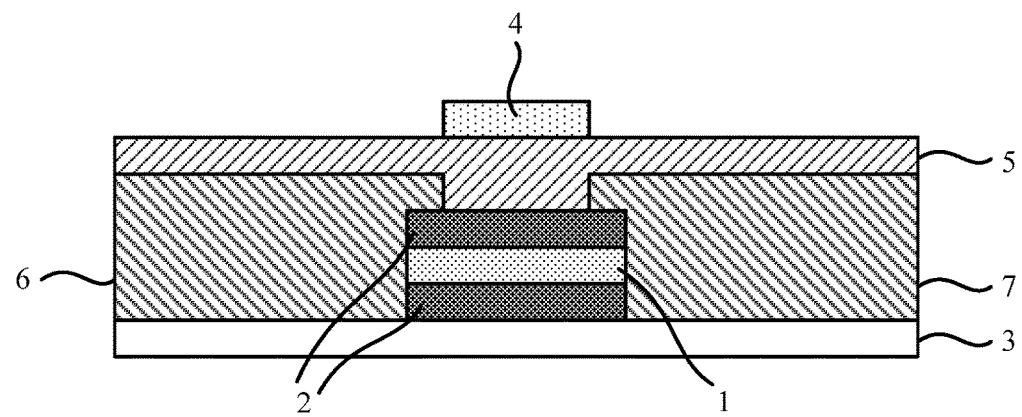
FIG. 9 is an illustrative structural view of a thin film transistor according to yet another embodiment of the present disclosure.

FIG. 9 illustrates a top gate type thin film transistor according to another embodiment of the present disclosure, in which light-protection layers can be provided above the active layer 1 as well as below the active layer 1. When there are light sources at the top and the bottom of the thin film transistor, light incident from both directions can be effectively absorbed, and thereby ensuring the stability of the active layer 1.

In one embodiment of the present disclosure, the width of the active layer 1 is equal to the width of the light-protection layer 2. The active layer 1 and the light-protection layer 2 can be formed firstly and then the two layers are etched by one photolithography process. Thus, the manufacturing process can be simplified.

In one embodiment of the present disclosure, the width of the light-protection layer 2 is greater than the width of the active layer 1. Since light incident on the active layer 1 is always not perpendicular incident light, by setting the width of the light-protection layer 2 to be greater than the width of the active layer 1, when light is incident onto the active layer 1 in a non-perpendicular manner, the light-protection layer 2 can still absorb light having a short wavelength so as to ensure the stability of the active layer 1.

For example, the light-protection layer 2 is configured to absorb light wave having a wavelength less than 539 nm.

The forbidden band gap of the light-protection layer 2 is greater than 1.1 eV and less than 2.3 eV and has a transmissivity lower than 70%. By use of materials having low light transmissivity, it can be ensured that there is less light transmitted to the opposite side of the light-protection layer 2 while ensuring the absorption for incident light. The influence of light on the active layer 1 can also be reduced.

For example, the light-protection layer 2 is made of metal oxide comprising at least one anion of fluorine, chlorine, bromine, sulfur, carbon, iodine and selenium and at least one cation of boron, aluminum, gallium, indium, tin, titanium, hafnium and silicon. The metal oxide containing at least one of the anions and at least one of the cations has characteristics of small forbidden band gap (that is to say, it can absorb light of shorter wavelength), strong light stability and low transmissivity.

The active layer 1 and the light-protection layer 2 can be made of the same or different materials, comprising but not limited to metal oxide semiconductors formed by at least one of metal elements such as indium (In), gallium (Ga), zinc (Zn), hafnium (Hf), tin (Sn), aluminum (Al) and the like, for example, ZnO, InZnO (IZO), ZnSnO (ZTO), InSnZnO (ITZO), GaZnO (GZO), InGaZnO (IGZO), HfInZnO (HIZO), SnInO (ITO), AlInZnO (AIZO) and etc.

For example, the light-protection layer 2 is made of zinc based nitrogen oxide.

The forbidden band gap of zinc based nitrogen oxide (ZnON) is 1.3 eV and can absorb light having a wavelength less than 1240/1.3=953 nm. Therefore, ZnON absorbs visible light and UV light and has a very low transmissivity of light in the range of ultraviolet and the visible light range, thereby achieving the effect of absorbing long wave and reducing light intensity.

Figure 10:
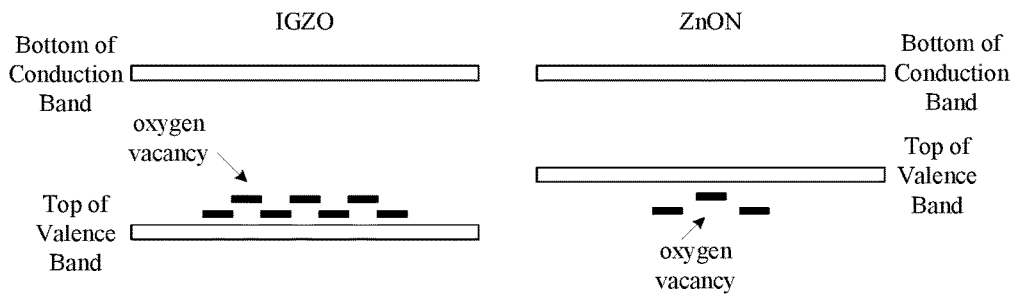
FIG. 10 is an illustrative view of comparison between the oxygen vacancies of zinc based nitrogen oxide and gallium indium zinc oxide according to another embodiment of the present disclosure.
Figure 11:
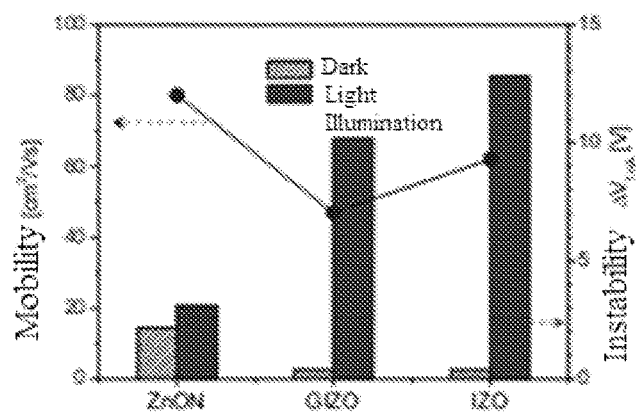
FIG. 11 is an illustrative view of stability comparison among zinc based nitrogen oxide, gallium indium zinc oxide and indium zinc oxide according to another embodiment of the present disclosure.

FIG. 10 and FIG. 11 illustrate the comparison result of the stability of ZnON with other materials. Since the oxygen vacancies in the materials typically depend on the number of oxygen ions, as illustrated in FIG. 10, anions in ZnON comprises oxygen ions and nitrogen ions, while anions in IGZO only comprise oxygen ions, the number of oxygen vacancies in IGZO is more than the number of oxygen vacancies in ZnON. Moreover, since the top of valence band top ZnON is higher than the top of valence band of IGZO, compared with electrons in the oxygen vacancies of IGZO, electrons in the oxygen vacancies of ZnON requires absorbing more energy to achieve the transition from the valence band to the conduction band. For the above two reasons, ZnON has less oxygen vacancies than IGZO, as well as less oxygen vacancy defect states (i.e., oxygen vacancies with lost electrons).

Further, as illustrated in FIG. 11, ZnON has relatively small changes in mobility and stability under dark and light circumstances, while GIZO and IZO have relatively big changes in mobility and stability under dark and light circumstances. It is seen that ZnON has a stronger light stability than GIZO and IZO and can better absorb light of short wavelength when being used as the light-protection layer 2 and is less likely to change.

For example, the thickness of the light-protection layer 2 is 5-100 nm. The light-protection layer of such thickness has a relatively low light transmissivity.

At least one embodiment of the present disclosure further provides a display device comprising any one of the above-described thin film transistors.

It should be noted that the display device in the embodiments of the present disclosure can be any product or component having display function such as electronic paper, cell phone, tablet PC, television, laptop, digital photo frame, navigator and etc.

Figure 12:
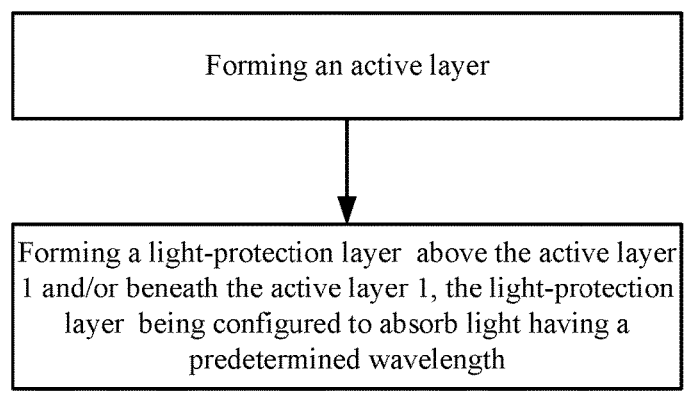
FIG. 12 is an illustrative flow chart of a method for manufacturing thin film transistor according to one embodiment of the present disclosure.

At least one embodiment of the present disclosure further provides a method for manufacturing thin film transistor, as illustrated in FIG. 12, comprising:

S1: forming an active layer 1; and

S2: forming a light-protection layer 2 above the active layer 1 and/or beneath the active layer 1, the light-protection layer 2 being configured to absorb light having a predetermined wavelength.

In one embodiment of the present disclosure, before forming the active layer 1, the method comprises:

forming a gate electrode 4 on a base substrate 3;

forming a gate insulating layer 5 on the gate electrode 4;

forming a source electrode 6 and a drain electrode 7, which are in contact with the active layer 1, on the gate insulating layer 5; and forming the active layer 1 comprises forming the active layer 1 above the gate insulating layer 5.

In one embodiment of the present disclosure, forming the active layer 1 comprises forming the active layer 1 on a substrate 3;

the method further comprises:

forming a source electrode 6 and a drain electrode 7, which are in contact with the active layer 1, on the substrate 3;

forming a gate insulating layer 5 on the source electrode 6 and the drain electrode 7; and forming a gate electrode 4 on the gate insulating layer 5.

It should be noted that the above process of forming the layers comprises but is not limited to (chemical phase, physical phase) deposition of film and (magnetron) sputtering. It can be understood by those skilled in the art that after each layer is formed, corresponding patterns can be formed in that layer as required, the detail description of which is omitted.

In the embodiments of the present disclosure, by providing a light-protection layer above the active layer, light incident onto the channel region from top of the thin film transistor can be absorbed, while by providing a light-protection layer under the active layer, light incident onto the channel region from bottom of the thin film transistor can be absorbed, thereby effectively avoiding influence of light on the active layer of the channel region and ensuring a relatively strong light stability of the driving transistor in the thin film transistor.

The foregoing are merely exemplary embodiments of the disclosure, but are not used to limit the protection scope of the disclosure. The protection scope of the disclosure shall be defined by the attached claims.

The present disclosure claims priority of Chinese Patent Application No. 201510309195.2 filed on Jun. 8, 2015, the disclosure of which is hereby entirely incorporated by reference as a part of the present disclosure.

The invention claimed is:

1. A thin film transistor comprising:
   an active layer, and a light-protection layer disposed above the active layer and/or disposed beneath the active layer,
   wherein the light-protection layer is configured to absorb light having a predetermined wavelength, and
   wherein a forbidden band gap of the light-protection layer is greater 1.1 eV and less than 2.3 eV with a transmissivity lower than 70%.

2. The thin film transistor according to claim 1, further comprising:
   a base substrate;
   a gate electrode disposed on the base substrate;
   a gate insulating layer disposed on the gate electrode; and
   a source electrode and a drain electrode which are disposed on the gate insulating layer and are in contact with the active layer,
   wherein the active layer is disposed above the gate insulating layer.

3. The thin film transistor according to claim 2, wherein a width of the active layer is equal to a width of the light-protection layer.

4. The thin film transistor according to claim 2, wherein a width of the light-protection layer is greater than a width of the active layer.

5. The thin film transistor according to claim 2, wherein the light-protection layer is configured to absorb light having a wavelength less than 539 nm.

6. The thin film transistor according to claim 1, further comprising:
   a base substrate;
   a source electrode and a drain electrode which are disposed on the base substrate and are in contact with the active layer;
   a gate insulating layer, disposed on the source electrode and the drain electrode; and
   a gate electrode disposed on the gate insulating layer,
   wherein the active layer is disposed above the base substrate.

7. The thin film transistor according to claim 6, wherein a width of the active layer is equal to a width of the light-protection layer.

8. The thin film transistor according to claim 6, wherein a width of the light-protection layer is greater than a width of the active layer.

9. The thin film transistor according to claim 1, wherein a width of the active layer is equal to a width of the light-protection layer.

10. The thin film transistor according to claim 1, wherein a width of the light-protection layer is greater than a width of the active layer.

11. The thin film transistor according to claim 1, wherein the light-protection layer is configured to absorb light having a wavelength less than 539 nm.

12. The thin film transistor according to claim 1, wherein the light-protection layer is made of a metal oxide comprising at least one anion of fluorine, chlorine, bromine, sulfur, carbon, iodine and selenium and at least one cation of boron, aluminum, gallium, indium, tin, titanium, hafnium and silicon.

13. The thin film transistor according to claim 1, wherein the light-protection layer is made of a zinc based nitrogen oxide.

14. The thin film transistor according to claim 1, wherein a thickness of the light-protection layer is 5-100 nm.

15. An array substrate, comprising the thin film transistor according to claim 1.

16. A display device, comprising the array substrate according to claim 15.

17. A method of manufacturing a thin film transistor, comprising:
   forming an active layer; and
   forming a light-protection layer above the active layer and/or beneath the active layer, the light-protection layer being configured to absorb light having a predetermined wavelength,
   wherein a forbidden band gap of the light-protection layer is greater than 1.1 eV and less than 2.3 eV with a transmissivity lower than 70%.

18. The method according to claim 17, wherein before forming the active layer, the method further comprises:
   forming a gate electrode on a base substrate;
   forming a gate insulating layer on the gate electrode; and
   forming a source electrode and a drain electrode, which are in contact with the active layer, on the gate insulating layer,
   wherein forming the active layer comprises forming the active layer above the gate insulating layer.

19. The method according to claim 17, wherein forming the active layer comprises forming the active layer on a base substrate, and wherein the method further comprises:
   forming a source electrode and a drain electrode, which are in contact with the active layer, on the base substrate;
   forming a gate insulating layer on the source electrode and the drain electrode; and
   forming a gate electrode on the gate insulating layer.

* * * * *